US005751111A

United States Patent [19]

Stoffels et al.

[11] Patent Number: 5,751,111

[45] Date of Patent: May 12, 1998

[54] HIGH-PRESSURE METAL HALIDE LAMP

[75] Inventors: Jan A.J. Stoffels; Denise K.L. Vandeperre; Jan M. Peeraer, all of Turnhout, Belgium

[73] Assignee: U.S. Philips Corporation, New York, N.Y.

[21] Appl. No.: 420,253

[22] Filed: Apr. 7, 1995

[30] Foreign Application Priority Data

Apr. 13, 1994 [EP] European Pat. Off. .............. 94201009

[51] Int. Cl.[6] .............................. H01J 17/00; H01J 61/00; H01J 61/04; H01J 17/04

[52] U.S. Cl. ........................... 313/606; 313/620; 313/634

[58] Field of Search .................................... 313/623, 624, 313/622, 625, 631, 634, 331, 332, 606, 638, 630, 639, 640–43, 570, 573

[56] References Cited

U.S. PATENT DOCUMENTS

| | | | |
|---|---|---|---|
| 2,207,133 | 7/1940 | Scott et al. | 313/623 |
| 4,924,146 | 5/1990 | Meeuwssen | 313/638 |
| 5,097,176 | 3/1992 | De Hair | 313/634 |
| 5,424,609 | 6/1995 | Geven | 313/623 |

FOREIGN PATENT DOCUMENTS

| | | | |
|---|---|---|---|
| 0011993 | 12/1978 | European Pat. Off. . | |
| 011993A1 | 6/1980 | European Pat. Off. | H01J 61/30 |
| 0215524 | 3/1987 | European Pat. Off. . | |
| 587238A1 | 3/1994 | European Pat. Off. | H01J 61/36 |

*Primary Examiner*—Ashok Patel
*Assistant Examiner*—Mack Haynes
*Attorney, Agent, or Firm*—Walter M. Egbert

[57] ABSTRACT

The invention relates to a high-pressure metal halide lamp provided with a discharge vessel with a ceramic wall enclosing a discharge space. The vessel has a cylindrical portion of internal diameter ID which is closed off at either end by end wall portions which form end faces of the discharge space. At least two electrodes are arranged in the discharge vessel, whose respective tips have an interspacing EA such that $$\frac{ID}{EA} > 0.4$$

The electrodes have lead-throughs which are enclosed in ceramic closing plugs and are connected thereto in a gastight manner by means of ceramic glazing joints.

According to the invention, the rated lamp power is at most 100 W, and an electrode tip lies substantially in the adjacent end face. A closing plug is fastened in the relevant end wall portion in a gastight manner at a distance from the end face.

16 Claims, 1 Drawing Sheet

HIGH-PRESSURE METAL HALIDE LAMP

BACKGROUND OF THE INVENTION

The invention relates to a high-pressure metal halide lamp comprising a discharge vessel which encloses a discharge space, which has a ceramic wall and a filling which comprises besides Hg, and a rare gas and at least one metal halide, and which is formed from a cylindrical portion with an internal diameter ID closed off at either end by end wall portions, each end wall portion forming an end face of the discharge space while at least one end wall portion is provided with an opening in which a ceramic closing plug is fastened which narrowly encloses over a length 1 a lead-through of a respective electrode provided with an electrode tip and is connected thereto in a gastight manner at the side facing away from the discharge space by means of a ceramic glazing joint, the discharge vessel containing at least two electrodes whose respective tips are situated at a mutual interspacing EA such that the following relation is satisfied $$\frac{ID}{EA} > 0.4$$

A lamp of the kind mentioned in the opening paragraph is known from EP-A-0 215 524 (PHN 11.485). The term "ceramic wall" is here understood to mean a wall of a refractory material such as monocrystalline metal oxide (for example, sapphire), polycrystalline metal oxide (for example, polycrystalline densely sintered aluminium oxide; yttrium-aluminium garnet, or yttrium oxide), and polycrystalline non-oxidic material (for example, aluminium nitride). Such materials allow for high wall temperatures up to 1500–1600 K and are satisfactorily resistant to chemical attacks by halides and by Na.

The internal diameter is defined in the present description and claims as 1.12 times the square root of the quotient of the volume of the discharge space between the electrode tips and EA.

The known lamp contains metal halide in excess. The metal halide vapour pressure, and thus the partial pressures of the ingredients, are governed by the temperature of the free surface of the excess quantity. This temperature is called cold spot temperature for short ($T_{KP}$). A colour temperature $T_c$ in the comparatively low range from approximately 2500 K to 3500 K can be realised with the known lamp with a high luminous efficacy as well as good colour rendering properties.

A typical characteristic of the lamp of the kind mentioned in the opening paragraph is the comparatively great internal diameter ID of the discharge vessel in relation to the distance between the electrode tips EA. One of the results of this is that the location where $T_{KP}$ prevails in lamps having a prior-art discharge vessel is situated near an end face at the discharge vessel wall.

In the known lamp, the electrodes project over some distance into the discharge space, so that there is a considerable tip-to-bottom distance, i.e. the distance between the electrode tip and the location of $T_{KP}$. This is found to result in too low vapour pressures of the halides present in lamps of comparatively low power. This manifests itself in a deviating colour temperature $T_c$ of the light radiated by the lamp and a deviation in colour point in the chromaticity diagram, in particular in the form of differences with differing burning positions of the lamp. A reduction of the tip-to-bottom distance gives rise to attacks on the ceramic discharge vessel wall in many cases, in particular on the ceramic closing plug. Fractures also frequently occur in the end wall portion or the closing plug, or both. Chemical attacks and fractures form problems in the realisation of a lamp with a reliable life expectancy.

SUMMARY OF THE INVENTION

The invention has for its object to provide a measure for counteracting the problems described. According to the invention, a lamp of the kind mentioned in the opening paragraph is for this purpose characterized in that the lamp has a rated power of at most 100 W, in that at least one electrode tip is situated substantially in the adjacent end face, and in that the relevant ceramic closing plug is fastened in the end wall portion in a gastight manner at a distance from the end face.

It is found to be possible with the measure according to the invention to realise a lamp with an increased $T_{KP}$. Since the ceramic closing plug does not extend up to the end face but is situated at a distance therefrom, problems involving chemical attacks and fractures are found to be solved. It is an advantage of the invention, accordingly, that a lamp with a very small tip-to-bottom distance can be realised. In an advantageous embodiment, the closing plug is fastened in the end wall portion in a gastight manner at a distance of 1 mm from the end face. The gastight fastening between the end wall portion and the closing plug is preferably realised by means of a sintered joint. This type of joint is in fact as resistant to high temperatures and attacks as are the ceramic wall portions themselves.

To obtain a substantially straight arc in every burning position, the lamp according to the invention preferably complies with the relation $$0,9 < \frac{ID}{EA} < 1.3$$

The colour temperature of the light radiated by the lamp will then be substantially the same in all burning positions.

Suitable metals for forming the metal halide in the discharge vessel are Na, Tl, Sc, Y, and the lanthanides.

A further improvement of the lamp according to the invention can be realised in that the filling of the discharge vessel also comprises Mg in the form of a halide. This favourably affects the maintenance of a good luminous efficacy during lamp life.

The filling of the discharge vessel comprises besides Hg and a rare gas one or several halides, usually iodides. A suitable rare gas is, for example, Ar which has an ignition-promoting effect.

A high-pressure metal halide lamp with a ceramic discharge vessel is known per se from EP-A-0 011 993 with a narrowed portion at either end, where electrode tips lie substantially in one plane with the narrowed portion near the relevant electrode. The lamp, which has a power of at least 100 W and more, for example 150 W and 250 W, has a considerable interspacing between the electrode tips (2 cm), and as a necessary consequence a comparatively small diameter. This renders the lamp unsuitable for realising a colour temperature in the region between approximately 2500 K and 3500 K with at the same time a comparatively high luminous flux and a good colour rendering.

BRIEF DESCRIPTION OF THE DRAWINGS

The above and other aspects of the invention will be explained in more detail with reference to a drawing of an embodiment of a lamp according to the invention, in which FIG. 1 diagrammatically shows a lamp according to the invention.

Figure 1:
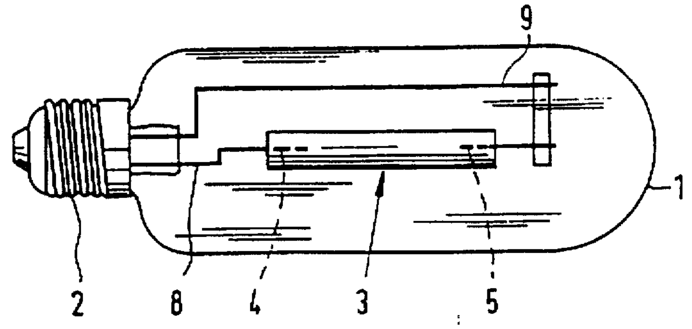
FIG. 1 shows a high-pressure metal halide lamp provided with a discharge vessel 3 with a ceramic wall which encloses a discharge space 11 and with a filling which comprises besides Hg and a rare gas at least one metal halide. The discharge vessel is enclosed in an outer envelope 1 which is provided with a lamp cap 2 at one end. The discharge vessel is provided with internal electrodes 4, 5 between which a discharge extends in the operational state of the lamp. Electrode 4 is connected to a first electrical contact forming part of the lamp cap 2 via a current conductor 8. Electrode 5 is connected to a second electrical contact forming part of the lamp cap 2 via a current conductor 9. The discharge vessel, shown in more detail in FIG. 2 (not true to scale), has a ceramic wall and is formed from a cylindrical portion with an internal diameter ID closed off at either end by end wall portions 32*a*, 32*b*, each end wall portion 32*a*, 32*b* forming an end face 33*a*, 33*b* of the discharge space. The end wall portions each have an opening in which a ceramic closing plug 34, 35 is fastened in the end wall portion 32*a*, 32*b* in a gastight manner by means of a sintered joint S. The ceramic closing plugs 34, 35 each narrowly enclose over a length 1 a lead-through 40, 41, 41*a*, 50, 51, 51*a* of an associated electrode 4, 5 provided with a tip 4*b*, 5*b*. The lead-through is connected to the closing plug 34, 35 in a gastight manner by means of a ceramic glazing joint 10 at its side facing away from the discharge space. The electrode tips 4*b*, 5*b* are situated at a mutual distance EA. The lead-throughs each comprise a halide-resistant portion 41, 51 made of, for example, Mo, enclosed by an Mo coil 41*a*, 51*a*, and a portion 40, 50 which is fastened to an associated closing plug 34, 35 in a gastight manner by means of the ceramic glazing joint 10. Each Mo coil 41*a*, 51*a* extends up to the relevant lead-through portion 40, 50. The ceramic glazing joint extends over some distance, for example approximately 1 mm, over the Mo coil 41*a*, 51. The portions 40, 50 are made of a metal which has a coefficient of expansion which harmonizes very well with that of the closing plugs. For example, Nb is a very suitable material. The portions 40, 50 are connected to the current conductors 8, 9 in a manner not shown in detail. The lead-through construction described renders it possible to operate the lamp in any burning position as desired.
Figure 2:
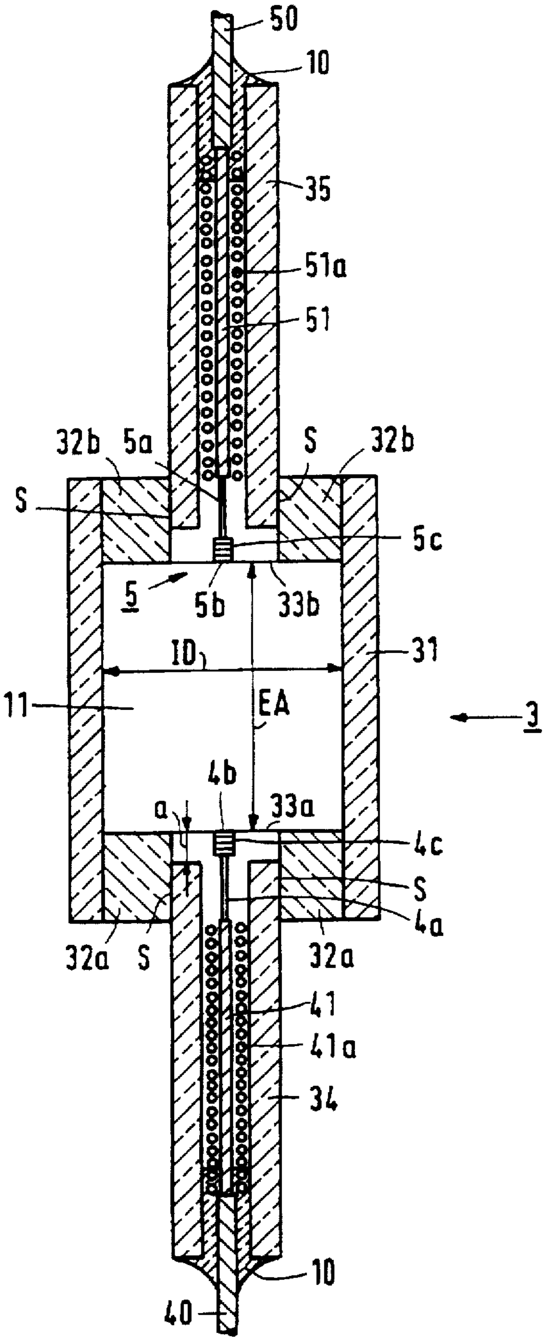
FIG. 2 shows the discharge vessel of the lamp of FIG. 1 in detail.

Each electrode 4, 5 comprises an electrode rod 4*a*, 5*a* which is provided with a winding 4*c*, 5*c* near the tip 4*b*, 5*b*. The electrode tips lie substantially in the planes defined by the end faces 33*a*, 33*b* of the end wall portions.

DESCRIPTION OF THE PREFERRED EMBODIMENTS

The closing plugs do not extend up to the end faces but are fastened in the end wall portions in a gastight manner by means of a sintered joint S at a distance a from the end faces.

In a practical embodiment of a lamp according to the invention as depicted in the drawing, the rated lamp power is 70 W. The filling of the discharge vessel is 4.4 mg Hg and 8 mg NaJ, TlJ, and $(Dy+Ho+Tm)I_3$ in a mass ratio of 65:10:25. The lamp also contains Ar as an ignition gas. The lamp was designed to supply a colour temperature of 3000 K with colour point coordinates (x,y) (437,404) and a general colour rendering index Ra above 80.

The discharge vessel is made of polycrystalline aluminium oxide, has an internal diameter ID of 6.85 mm and an interspacing between the electrode tips EA of 7 mm. The closing plugs were sintered in the end wall portions at a distance a of 1 mm from the end faces formed by the end wall portions. The end wall portions have a height of 3 mm so that the sintered joint with the closing plugs extends over a length of 2 mm. Such a length of the sintered joint was found to be sufficient in practice for realising a sufficiently strong and gastight fastening between the end wall portion and the closing plug also in the case of large-scale mass production. The electrode tips lie in the end face planes. The electrodes are made from a W rod which is provided with a W winding at the tip.

The lamp was subjected to a life test. The colour temperature of the light radiated by the lamp is 3150 K after one hour of operation, 3144 K after 100 hours, and 3096 K after 1000 hours. The luminous efficacy after 100 hours of operation is 88 lm/W, falling to 75 lm/W after 1000 hours of operation. The following colour point coordinates were measured for the light radiated by the lamp (x,y): (430,407); (431,410); (433,408).

A comparison between vertical and horizontal burning positions was made for a similar lamp after 100 hours of operation. The luminous efficacy in horizontal position was 85 lm/W and in vertical burning position 88 lm/W. The accompanying $T_c$, values and the coordinates of the colour point were 3013 K and 3096 K, and (437,405) and (431, 410). The general colour rendering index $R_a$ was 82 in both cases.

For comparison, the data measured for a prior-art lamp after 100 hours of operation: a luminous efficacy in horizontal position of 84 lm/W and in vertical position 88 lm/W. The accompanying $T_c$ values are 3033 K and 3240 K, and the colour point coordinates are (431,396) and (423,404). A value of 82 was measured for the colour rendering index $R_a$.

It is apparent from these data that the differences in colour temperature $T_c$ and in the colour point coordinates resulting from differences in burning position of the lamp are much smaller in the lamp according to the invention than in the known lamp. Since the lamp is designed for use as an interior lighting lamp (for example, shop window lighting) this is a major importance.

We claim:

1. A high-pressure metal halide lamp provided with a discharge vessel which encloses a discharge space, which has a ceramic wall and a filling which comprises besides Hg and a rare gas at least one metal halide, and which is formed from a cylindrical portion with an internal diameter ID closed off at either end by end wall portions, each end wall portion forming an end face of the discharge space while at least one end wall portion is provided with an opening in which a ceramic closing plug is fastened which narrowly encloses over a length 1 a lead-through of a respective electrode provided with an electrode tip and is connected thereto in a gastight manner at the side facing away from the discharge space by means of a ceramic glazing joint, the discharge vessel containing at least two electrodes whose respective tips are situated at a mutual interspacing EA such that the following relation is satisfied $$\frac{ID}{EA} > 0.4$$

wherein the lamp has a rated power of at most 100 W, in that at least one electrode tip is situated substantially in the adjacent end face, and in that the relevant ceramic closing plug is fastened in the end wall portion in a gastight manner at a distance from the end face.

2. A lamp as claimed in claim 1, wherein the closing plug is fastened in the end wall portion in a gastight manner at a distance of 1 mm from the end face.

3. A lamp as claimed in claim 2, wherein the ceramic closing plug is fastened in the end wall portion in a gastight manner by means of a sintered joint.

4. A lamp as claimed in claim 3, wherein the internal diameter ID and the mutual interspacing EA between the electrode tips comply with the relation $$0.9 < \frac{ID}{EA} < 1.3$$

5. A lamp as claimed in claim 4, wherein the filling of the discharge vessel comprises Mg.

6. A lamp as claimed in claim 1, wherein the ceramic closing plug is fastened in the end wall portion in a gastight manner by means of a sintered joint.

7. A lamp as claimed in claim 6, wherein the internal diameter ID and the mutual interspacing EA between the electrode tips comply with the relation $$0.9 < \frac{ID}{EA} < 1.3$$

8. A lamp as claimed in claim 7, wherein the filling of the discharge vessel comprises Mg.

9. A lamp as claimed in claim 6, wherein the filling of the discharge vessel comprises Mg.

10. A lamp as claimed in claim 2, wherein the internal diameter ID and the mutual interspacing EA between the electrode tips comply with the relation $$0.9 < \frac{ID}{EA} < 1.3$$

11. A lamp as claimed in claim 10, wherein the filling of the discharge vessel comprises Mg.

12. A lamp as claimed in claim 1, wherein the internal diameter ID and the mutual interspacing EA between the electrode tips comply with the relation $$0.9 < \frac{ID}{EA} < 1.3$$

13. A lamp as claimed in claim 12, wherein the filling of the discharge vessel comprises Mg.

14. A lamp as claimed in claim 3, wherein the filling of the discharge vessel comprises Mg.

15. A lamp as claimed in claim 2, wherein the filling of the discharge vessel comprises Mg.

16. A lamp as claimed in claim 1, wherein the filling of the discharge vessel comprises Mg.

* * * * *